(12) United States Patent
Zhang et al.

(10) Patent No.: US 11,878,532 B2
(45) Date of Patent: Jan. 23, 2024

(54) INKJET PLATFORM FOR FABRICATION OF OPTICAL FILMS AND STRUCTURES

(71) Applicant: Applied Materials, Inc., Santa Clara, CA (US)

(72) Inventors: Daihua Zhang, Los Altos, CA (US); Ludovic Godet, Sunnyvale, CA (US); Michael David-Scott Kemp, San Jose, CA (US); Kang Luo, Santa Clara, CA (US); Kazuya Daito, Milpitas, CA (US); Kenneth S. Ledford, San Jose, CA (US); Bahubali S. Upadhye, Bangalore (IN); Hemantha Raju, Bangalore (IN); John Rusconi, Dublin, CA (US); Elsa Massonneau, Sunnyvale, CA (US); Mahendran Chidambaram, Saratoga, CA (US); Alexey Stepanov, Sunnyvale, CA (US); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 17/647,820

(22) Filed: Jan. 12, 2022

(65) Prior Publication Data

US 2022/0363064 A1 Nov. 17, 2022

(30) Foreign Application Priority Data

May 11, 2021 (IN) .............................. 202141021237

(51) Int. Cl.
*B41J 2/175* (2006.01)
*H01L 21/00* (2006.01)

(52) U.S. Cl.
CPC .............. *B41J 2/175* (2013.01); *H01L 21/00* (2013.01)

(58) Field of Classification Search
CPC .... B41J 2/175; B41J 3/60; B41J 3/407; H01L 21/00; H10K 71/135

(Continued)

(56) References Cited

U.S. PATENT DOCUMENTS 9,343,678 B2 5/2016 Ko et al.
2009/0098293 A1* 4/2009 Hoffmann ............... H01L 21/56
427/265

(Continued)

FOREIGN PATENT DOCUMENTS

FR 2827807 B1 10/2003
WO 2013015157 A1 1/2013
WO 2021022864 A1 2/2021

OTHER PUBLICATIONS

Eureopean Search Report issued to 22156113.7 dated Aug. 12, 2022.

*Primary Examiner* — Matthew Luu
*Assistant Examiner* — Alexander D Shenderov
(74) *Attorney, Agent, or Firm* — Patterson + Sheridan, LLP

(57) ABSTRACT

Embodiments described herein relate to an inkjet printing platform. The inkjet printing platform is utilized for fabrication of optical films and optical device structures. The inkjet printing platform includes a transfer chamber, one or more inkjet chambers, a plurality of auxiliary modules, a substrate flipper, and load ports. The inkjet printing platform is operable to perform an inkjet printing process on a substrate to form an optical film and/or an optical device.

20 Claims, 5 Drawing Sheets

(58) Field of Classification Search
USPC .......................................................... 347/85
See application file for complete search history.

(56) References Cited

U.S. PATENT DOCUMENTS

| | | | |
|---|---|---|---|
| 2015/0014636 A1* | 1/2015 | Kang | H10K 50/8428 |
| | | | 438/26 |
| 2015/0259786 A1* | 9/2015 | Ko | H01L 21/6719 |
| | | | 118/620 |
| 2020/0384788 A1* | 12/2020 | Koenig | B29D 11/00644 |
| 2021/0260892 A1* | 8/2021 | Chen | B05B 13/0242 |

* cited by examiner

INKJET PLATFORM FOR FABRICATION OF OPTICAL FILMS AND STRUCTURES

CROSS-REFERENCE TO RELATED APPLICATIONS

This application claims the benefit of Indian Provisional Patent Application No. 202141021237, filed May 11, 2021, which is herein incorporated by reference.

BACKGROUND

Field

Embodiments of the present disclosure generally relate to optical devices for augmented, virtual, and mixed reality. More specifically, embodiments described herein provide for an inkjet printing platform. The inkjet printing platform is utilized for fabrication of optical films and optical device structures.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is fabricating optical films and optical devices. Conventional approaches have attempted to use inkjet printing to address these challenges, however, it is difficult to integrate inkjet systems to efficiently perform the inkjet printing processes. Accordingly, what is needed in the art is an inkjet printing platform.

SUMMARY

In one embodiment, an inkjet printing platform is provided. The inkjet printing platform includes a transfer chamber and at least one load port coupled to the transfer chamber. The inkjet printing platform further includes a plurality of auxiliary modules coupled to the transfer chamber. The inkjet printing platform further includes one or more inkjet chambers coupled to the transfer chamber, a substrate flipper coupled to the transfer chamber, a pre-aligner disposed in the transfer chamber.

In another embodiment, an inkjet printing platform is provided. The inkjet printing platform includes one or more inkjet chambers coupled to a transfer chamber. Each inkjet chamber includes an inkjet printer disposed in a processing region of the inkjet chamber. The inkjet printer includes a moveable stage configured to support a substrate and move along a pair of tracks and a processing apparatus disposed above the moveable stage. The processing apparatus includes a plurality of printheads, at least one alignment camera, and a plurality of ink recirculation modules coupled to the plurality of printheads. The one or more inkjet chambers further include a fan filter unit disposed in the processing region; and an exhaust port disposed in a lower region of the inkjet chamber.

In yet another embodiment, a method of processing a substrate is provided. The method includes removing a substrate from a load port of an inkjet printing platform and positioning the substrate in a pre-aligner disposed in a transfer chamber of the inkjet printing platform. The substrate is aligned by the pre-aligner. The method further includes positioning the substrate in at least one inkjet chamber coupled to the transfer chamber. The substrate is positioned on a stage of an inkjet printer disposed in the inkjet chamber. The inkjet printer is configured to deposit one or more inkjet materials on the substrate from a plurality of printheads. The method further includes positioning the substrate in at least one auxiliary module coupled to the transfer chamber. The auxiliary module is configured to perform one or more of a plasma cleaning, lithography, baking, cooling, curing, deposition, surface modification, and imprinting process. The method further includes returning the substrate to the load port of the inkjet printing platform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to an inkjet printing platform. The inkjet printing platform is utilized for fabrication of optical films and optical device structures. [Will add upon approval of claims]

Figure 1:
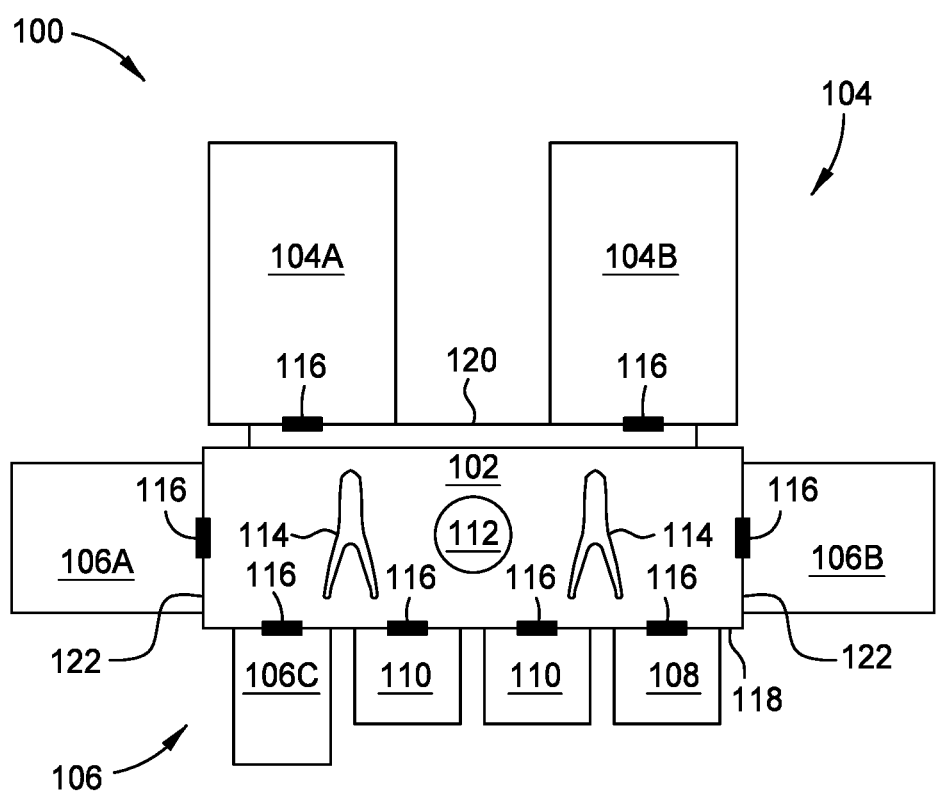
FIG. 1 is a schematic view of an inkjet printing platform according to embodiments.

FIG. 1 is a schematic view of an inkjet printing platform 100. The inkjet printing platform 100 includes a transfer chamber 102, one or more inkjet chambers 104, a plurality of auxiliary modules 106, a substrate flipper 108, and load ports 110. The transfer chamber 102 includes a pre-aligner 112 and two transfer robots 114 disposed therein. The transfer robots 114 are operable to transfer one or more substrates from the load ports 110 and between the plurality of auxiliary modules 106, the substrate flipper 108, the pre-aligner 112, and the inkjet chambers 104.

The inkjet printing platform 100 is operable to process a substrate to form an optical film and/or an optical device. In one embodiment, which can be combined with other embodiments described herein, the substrate is an optical device substrate. The processing of the substrate may include an inkjet printing process. The substrate is any suitable substrate on which an optical device or optical device film may be formed. In one embodiment, the substrate includes, but is not limited to, silicon (Si), silicon nitride (SiN), silicon dioxide ($SiO_2$), fused silica, quartz, silicon carbide (SiC), germanium (Ge), silicon germanium (SiGe), indium phosphide (InP), gallium arsenide (GaAs), gallium oxide (GaO), diamond, lithium niobate ($LiNbO_3$), gallium nitride (GaN), sapphire, tantalum oxide ($Ta_2O_5$), titanium dioxide ($TiO_2$), or combinations thereof. The substrate may have a diameter in a range from about 100 mm to about 750 mm. In one example, the substrate has a surface area of about 1,000 $cm^2$ or more. In another example, the surface area of the substrates may be about 2,000 $cm^2$ or more, and about 4,000 $cm^2$ or more.

The inkjet printing process performed in the inkjet printing platform 100 assists in the fabrication of at least one optical device or an optical film. It is to be understood that the at least one optical device described herein is an exemplary optical device and other optical devices may be used with or modified to accomplish aspects of the present disclosure. In one embodiment, which can be combined with other embodiments described herein, the optical device is a waveguide combiner. The waveguide combiner may be utilized for virtual, augmented, or mixed reality. In another embodiment, which can be combined with other embodiments described herein, the optical device is a micro-lens array. In another embodiment, which can be combined with other embodiments described herein, the optical device is utilized for prescription glasses. In yet another embodiment, which can be combined with other embodiments described herein, the optical device is a flat optical device, such as a metasurface.

Prior to processing, the substrates are removed from the at least one load port 110 by one of the transfer robots 114 and transferred to the transfer chamber 102. The load ports 110 are formed in a first portion 118 of the transfer chamber 102. Upon completion of substrate processing in the inkjet printing platform 100, the processed substrates may be returned to their respective load ports 110. The load ports 110 are configured to automatically load and unload the substrates. The substrate can be accessed by the transfer robots 114 through a slit valve 116 formed between the load ports 110 and the transfer chamber 102. The transfer robots 114 are configured to handle edges of a backside surface of the substrate to avoid backside surface contamination.

Prior to processing, the transfer robot 114 places the substrate on the pre-aligner 112. The pre-aligner 112 may be positioned in the transfer chamber 102. The pre-aligner 112 is operable to at least one of read an identification of a substrate or detect an orientation of the substrate. The pre-aligner 112 is configured to align the substrate in a desired rotational orientation within the inkjet printing platform 100 based on the identification and the orientation of the substrate. In some embodiments, which can be combined with other embodiments described herein, the pre-aligner 112 may include a heat source, such as lamps or infrared generating radiant heaters, adapted to heat the substrate to a desired temperature. The pre-aligner 112 can further be pressurized under a vacuum condition to ensure that any undesirable water or other contamination is removed from the surface of the substrate prior to processing.

The transfer robots 114 are operable to position the substrate in one of a plurality of auxiliary modules 106. For example, as shown in FIG. 1, the inkjet printing platform 100 includes the first auxiliary module 106A, the second auxiliary module 106B, and the third auxiliary module 106C. The plurality of auxiliary modules 106 are coupled to at least one of side portions 122, the first portion 118 or a second portion 120 of the transfer chamber 102. For example, as shown in FIG. 1, the first auxiliary module 106A is coupled to the side portion 122, the second auxiliary module 106B is coupled to the first portion 118, and the third auxiliary module 106C is coupled to the first portion 118. The plurality of auxiliary modules are coupled to the transfer chamber 102 via a plurality of slit valves 116. The transfer robots 114 place the substrates into the auxiliary modules 106A-106C via the slit valves 116. The plurality of auxiliary modules 106 can be selectively isolated from the transfer chamber 102 by use of the slit valves 116 that are disposed between each of the plurality of auxiliary modules 106 and the transfer chamber 102. The first auxiliary module 106A is at least one of a plasma module, lithography module, baking module, chilling module, ultraviolet (UV) curing module, or imprinting module. The second auxiliary module 106B is at least one of a plasma module, lithography module, baking module, chilling module, ultraviolet (UV) curing module, or imprinting module. The third auxiliary module 106C is at least one of a plasma module, lithography module, baking module, chilling module, ultraviolet (UV) curing module, or imprinting module. The substrate may be transferred to one of the plurality of auxiliary modules 106 prior to the inkjet printing process or after the inkjet printing process performed in the inkjet chambers 104. Although the three auxiliary modules 106A-106C are shown in FIG. 1, the inkjet printing platform 100 is not limited in the number of auxiliary modules included. For example, one or more auxiliary modules 106 may be coupled to the transfer chamber 102.

The transfer robots 114 are further operable to position the substrate in one of the inkjet chambers 104. For example, as shown in FIG. 1, the inkjet printing platform 100 includes the first inkjet chamber 104A and the second inkjet chamber 104B. The inkjet chambers 104 may be coupled to the second portion 120 of the transfer chamber 102 opposing the third auxiliary module 106C, the load ports 110, and the substrate flipper 108. The inkjet chambers 104 are operable to perform an inkjet printing process on the substrate. The inkjet printing process enables selective coating of the substrate with an inkjet material to avoid contamination in sensitive areas of the substrate. The thickness of the inkjet material on the substrate may also be modulated with the inkjet printing process to form a thickness profile. Additionally, the inkjet printing process minimizes material usage when forming the optical films or the substrates.

In some embodiments, which can be combined with other embodiment described herein, the inkjet printing process, in combination with a lithography process performed in one of the plurality of auxiliary modules 106, may form a plurality of optical device structures on the substrate. The optical device structures may be nanostructures having sub-micron dimensions, e.g., nano-sized dimensions.

The first inkjet chamber 104A and the second inkjet chamber 104B are coupled to the transfer chamber 102 via a plurality of slit valves 116. The transfer robots 114 place the substrates into the first inkjet chamber 104A and the second inkjet chamber 104B through the slit valves 116. The plurality of slit valves 116 provide an opening for a portion of the transfer robot 114 to enter into the inkjet chambers 104 to place the substrate on a stage (shown in FIG. 3). The first inkjet chamber 104A and the second inkjet chamber 104B can be selectively isolated from the transfer chamber 102 by use of the slit valves 116 that are disposed between each of the first inkjet chamber 104A and the transfer chamber 102, as well as the second inkjet chamber 104B and the transfer chamber 102. The first inkjet chamber 104A and the second inkjet chamber 104B can further be pressurized under a vacuum condition when the slit valve 116 is closed to ensure that any undesirable water or other contamination is removed from the surface of the substrate during the inkjet printing process. Each of the first inkjet chamber 104A and the second inkjet chamber 104B may be different than the other inkjet chamber. For example, the first inkjet chamber 104A may be configured to deposit a different inkjet material than the second inkjet chamber 104B. Although two inkjet chambers 104 are shown in FIG. 1, the inkjet printing platform 100 is not limited in the number of inkjet chambers 104. For example, one or more inkjet chambers 104 may be coupled to the transfer chamber 102.

After the inkjet printing process is performed in the at least one inkjet chamber 104, the transfer robots 114 are operable to position the substrate in the substrate flipper 108. The substrate flipper 108 may be coupled to the first portion 118 of the transfer chamber 102. The substrate flipper 108 is coupled to the transfer chamber 102 via a slit valve 116. The substrate flipper 108 flips the substrate such that a backside surface of the substrate is facing upwards. The substrate may be removed from the substrate flipper 108 and positioned in one of the plurality of auxiliary modules 106 and/or one of the inkjet chambers 104. The substrate flipper 108 allows for double-side processing of the substrate. The capability of double-side processing allows the inkjet printing platform 100 to form functional optical films or optical devices on both surfaces of the substrate, which largely expands the design space and functionality of the substrate.

Figure 2:
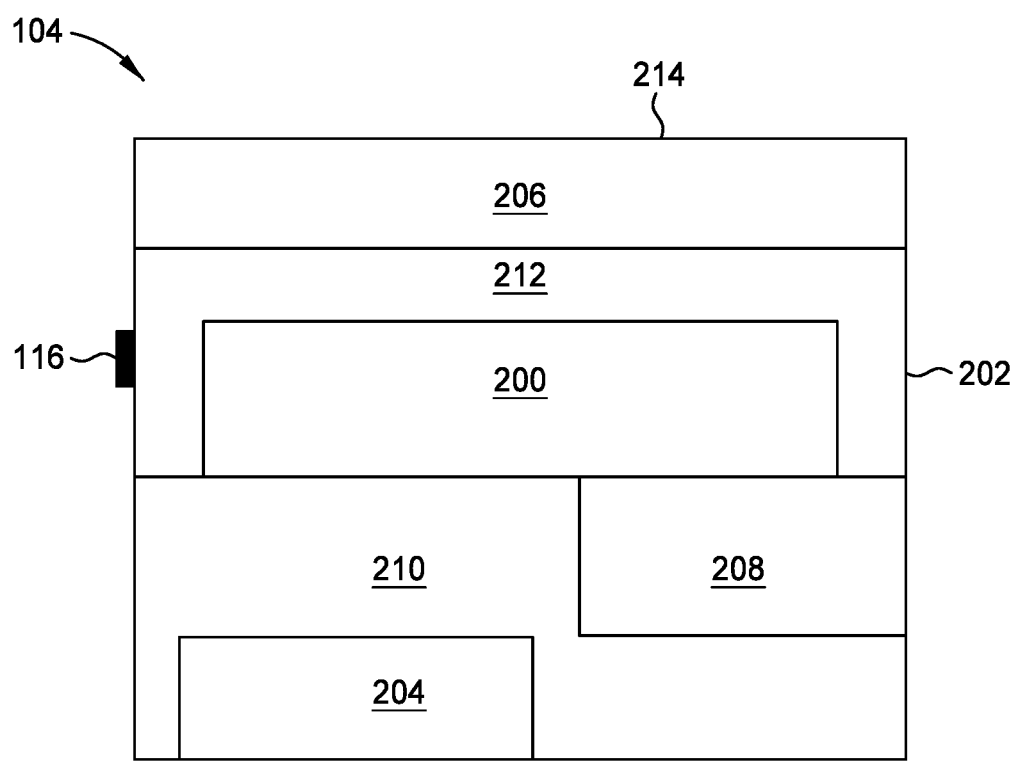
FIG. 2 is a schematic, side-view of an inkjet chamber according to embodiments.

FIG. 2 is a schematic, side-view of an inkjet chamber 104. The inkjet chamber 104 may correspond to the first inkjet chamber 104A and/or the second inkjet chamber 104B, shown in FIG. 1. The inkjet chamber 104 is included in the inkjet printing platform 100. The inkjet chamber 104 includes an enclosure 202. The enclosure 202 encloses an inkjet printer 200, a fluid supply manifold 204, a fan filter unit 206, and an exhaust port 208 within the inkjet chamber 104. The inkjet printer 200 and the fan filter unit 206 are disposed in a processing region 212 of the inkjet chamber. An inkjet printing process is performed with the inkjet printer 200 within the processing region 212. The exhaust port 208 and the fluid supply manifold 204 are disposed in a lower region 210 of the inkjet chamber 104. The lower region 210 is disposed below the processing region 212. The enclosure 202 includes a slit valve 116 therethrough such that a transfer robot 114 (shown in FIG. 1) may position the substrate in the processing region 212.

The fluid supply manifold 204 is disposed in the lower region 210. The fluid supply manifold 204 may include a plurality of supply fluids. For example, the fluid supply manifold 204 may include maintenance fluids utilized for maintenance of the inkjet chamber 104. The fluid supply manifold 204 may also include material sources, such as inkjet materials, utilized in the inkjet printing process. The fluid supply manifold 204 may be fluidly coupled to the inkjet printer 200.

The exhaust port 208 is disposed in the lower region 210. The exhaust port 208 is fluidly coupled to the processing region 212. The exhaust port 208 is operable to remove contaminants from the processing region 212 produced during processing. In one embodiment, which can be combined with other embodiments described herein, contaminants such as volatile organic compounds (VOCs) generated by the inkjet material or maintenance materials are removed via the exhaust port 208. The processing region 212 is maintained at a negative pressure to avoid the contaminants leaking outside of the inkjet chamber 104.

The fan filter unit 206 is disposed in the processing region 212. The fan filter unit 206 is coupled to a top surface 214 of the enclosure 202. The fan filter unit 206 is operable to create a vertical flow of clean, dry air through the processing region 212. The fan filter unit 206 maintains the processing region 212 at a positive pressure to minimize air and particle intake from outside the inkjet chamber 104. The fan filter unit 206 and the exhaust port 208 provide independent pressure control in the processing region 212. The fan filter unit 206 and the exhaust port 208 provide for control of the processing region 212. The control of the processing region 212 ensures process quality and consistency when processing the substrates.

Figure 3:
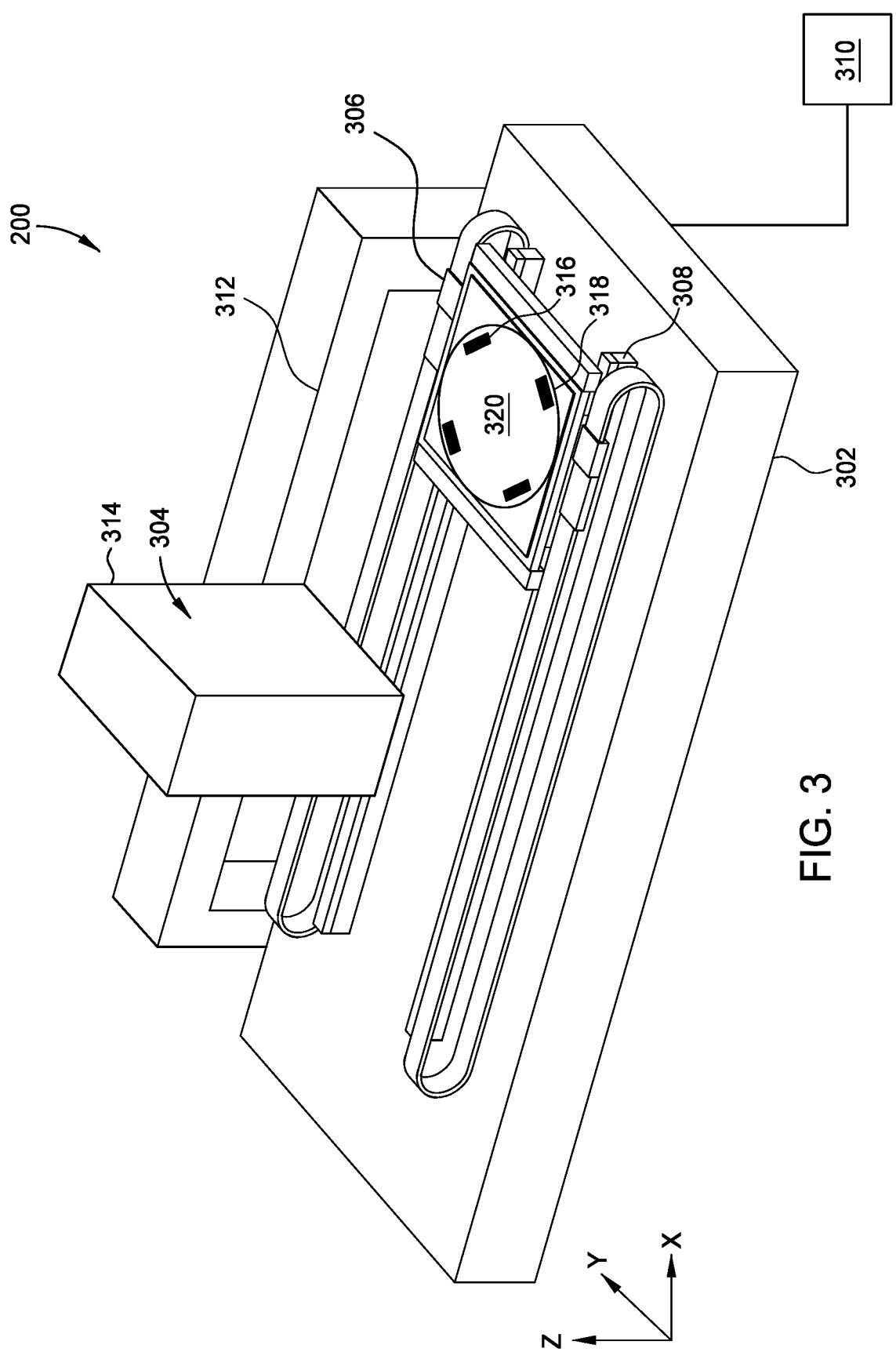
FIG. 3 is a perspective view of an inkjet printer according to embodiments.

FIG. 3 is a perspective view of an inkjet printer 200. The inkjet printer 200 is disposed in a processing region 212 (shown in FIG. 2) of an inkjet chamber 104 (shown in FIG. 2). The inkjet printer 200 includes a stage 306 and a processing apparatus 304. The stage 306 is supported by a pair of tracks 308 disposed on a slab 302. A substrate 320 is supported by the stage 306. The stage 306 moves along the pair of tracks 308 in at least one of an X direction, a Y direction, or a Z direction, as indicated by the coordinate system shown in FIG. 3. In one embodiment, the pair of tracks 308 is a pair of parallel magnetic channels. As shown, each track 308 of the pair of tracks 308 is linear. In other embodiments, the pair of tracks 308 may have a non-linear shape. In one embodiment, which can be combined with other embodiments described herein, an encoder is coupled to the stage 306 in order to provide information of the location of the stage 306 to a controller 310. The controller 310 is generally designed to facilitate the control and automation of the inkjet printing process described herein. The controller 310 may be coupled to or in communication with the processing apparatus 304, the stage 306, and the encoder.

The processing apparatus 304 is coupled to a support 312. The processing apparatus 304 is disposed over the pair of tracks 308. The pair of tracks 308 and the stage 306 are operable to pass under the processing apparatus 304. The processing apparatus 304 is supported over the slab 302 by the support 312. The processing apparatus 304 includes a case 314. The processing apparatus 304 is operable to distribute one or more inkjet materials onto the substrate 320. The substrate 320 is positioned on the stage 306 via one of the transfer robots 114 (shown in FIG. 1). The stage 306 may include vacuum slots 316 to retain the substrate 320. The vacuum slots 316 are between 1 millimeter and 5 millimeters from an edge 318 of the substrate 320. In one embodiment, which can be combined with other embodiments described herein, the vacuum slots 316 are elevated from the surface of the stage 306. The vacuum slots 316 retain the substrate 320 while minimizing contact to a backside surface of the substrate 320 and contamination of the substrate 320.

Figure 4:
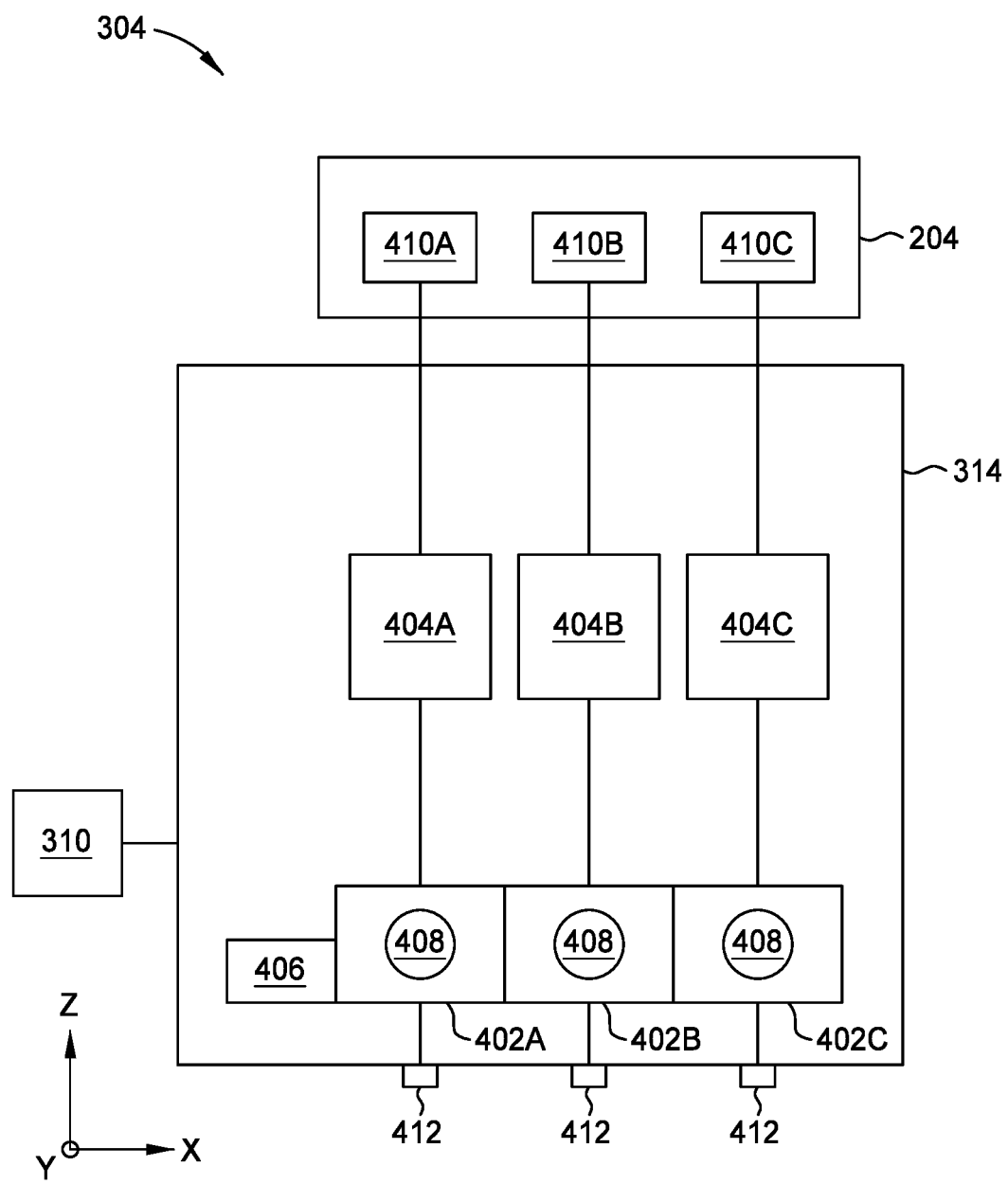
FIG. 4 is a schematic, side-view of a processing apparatus according to embodiments.

FIG. 4 is a schematic, side-view of a processing apparatus 304. The processing apparatus 304 may be disposed in an inkjet printer 200 (shown in FIG. 2). The processing apparatus 304 is operable to distribute one or more inkjet materials onto the substrate 320 (shown in FIG. 3). The processing apparatus 304 includes a plurality of printheads 402A-402C, a plurality of ink recirculation modules 404A-404C, at least one alignment camera 406, and a plurality of alignment mechanisms 408. The plurality of printheads 402A-402C, the plurality of ink recirculation modules 404A-404C, the at least one alignment camera 406, and the plurality of alignment mechanisms 408 are disposed in a case 314 of the processing apparatus 304.

The processing apparatus 304 may include one or more printheads 402A-402C. For example, as shown in FIG. 4, the processing apparatus 304 includes a first printhead 402A, a second printhead 402B, and a third printhead 402C. Although only three of the plurality of printheads 402A-402C are shown in FIG. 4, the processing apparatus 304 is not limited in the number of printheads 402A-402C included in the case 314. For example, one or more printheads 402A-402C may be included in the case 314. In one embodiment, which can be combined with other embodiments described herein, a first inkjet chamber 104A (shown in FIG. 1) includes three printheads 402A-402C and a second inkjet chamber 104B (shown in FIG. 1) includes four printheads. In another embodiment, which can be combined with other embodiments described herein, the first inkjet chamber 104A (shown in FIG. 1) and the second inkjet chamber 104B (shown in FIG. 1) include the same number of printheads 402A-402C in the processing apparatus 304.

A fluid supply manifold 204 disposed in the inkjet chamber 104 includes one or more inkjet material sources 410A-410C. Each inkjet material source 410A-410C is fluidly coupled to one of the plurality of printheads 402A-402C. For example, a first inkjet material source 410A is coupled to the first printhead 402A, a second inkjet material source 410B is coupled to the second printhead 402B, and a third inkjet material source 410C is coupled to the third printhead 402C. In one embodiment, which can be combined with other embodiments described herein, each inkjet material source 410A-410C may be loaded with different inkjet materials. In another embodiment, which can be combined with other embodiments described herein, the same inkjet material may be loaded into at least two inkjet material sources 410A-410C. Including the same inkjet material in multiple inkjet material sources 410A-410C improves throughput and the print resolution of the inkjet printing process. Including multiple inkjet materials in each inkjet chamber 104 increases the array of inkjet materials that may be deposited in the inkjet process. For example, each inkjet material may have different material properties, such as viscosity, to tune the optical film or the optical device to be formed by the inkjet printing process. The multiple inkjet materials further enables different materials to physically and/or chemically interact with each other on the substrate to create films and structures that require multiple inkjet materials, thus increasing the variety of optical films and optical devices formed.

As shown in FIG. 1, the first inkjet chamber 104A and the second inkjet chamber 104B are coupled to the transfer chamber 102. The first inkjet chamber 104A and the second inkjet chamber 104B each include a processing apparatus 304 with the one or more printheads 402A-402C. The configuration of the inkjet printing platform 100 improves the possible spectrum of optical films and optical devices that are produced in the inkjet printing platform 100 with increased quality. The quality of the optical films, optical device structures, and/or optical devices improves because a wide array of inkjet materials are able to be deposited within the inkjet printing platform 100. Therefore, the optical films, optical device structures, and/or optical devices to be formed remain in the environment of the inkjet printing platform 100 to avoid contamination. The possible spectrum of optical films and optical devices that are produced in the inkjet printing platform 100 is increased due to the first inkjet chamber 104A including a first set of one or more printheads 402A-402C configured to deposit an inkjet material with a first viscosity range and the second inkjet chamber 104B including a second set of one or more printheads 402A-402C configured to deposit an inkjet material with a second viscosity range. The first viscosity range is different from the second viscosity range. Examples of the inkjet materials include, but are not limited to, acrylate, oil, aqueous, or solvent based formulations, or combinations thereof.

In one embodiment, the one or more printheads 402A-402C in the first inkjet chamber 104A are configured to deposit different inkjet materials than the one or more printheads 402A-402C in the second inkjet chamber 104B. For example, the first inkjet chamber 104A includes thermal printheads and the second inkjet chamber 104B includes piezo printheads. Each different type of printhead is operable to deposit inkjet materials of different physical and chemical properties. For example, the viscosity of the inkjet materials to be deposited in the first inkjet chamber 104A is different than the viscosity of the inkjet material in the second inkjet chamber 104B. In one embodiment, which can be combined with other embodiments described herein, aqueous inks may be deposited in the first inkjet chamber 104A and oil-based inks can be deposited in the second inkjet chamber 104B. Further, as each of the processing apparatuses 304 in the first inkjet chamber 104A and the second inkjet chamber 104B can deposit multiple different inkjet materials, the range of inkjet materials that may be deposited in the inkjet printing platform increases. Each printhead 402A-402C can deposit a different inkjet material. For example, the first inkjet chamber 104A may deposit two or more different aqueous inkjet materials and the second inkjet chamber 104B may deposit two or more different oil-based inkjet materials.

Each of the one or more printheads 402A-402C includes a nozzle 412. Additionally, the nozzle 412 of each of the one or more printheads 402A-402C may be different. For example, a nozzle size of the nozzles 412 of each of the one or more printheads 402A-402C further allows for a range of inkjet materials to be deposited. The nozzle of each of the printheads 402A-402C in the first inkjet chamber 104A and the second inkjet chamber 104B can be chosen specifically based on the physical and chemical properties of the inkjet materials to be deposited. Therefore, inkjet materials with different physical and chemical properties can be deposited in the first inkjet chamber 104A and the second inkjet chamber 104B, respectively.

The first inkjet chamber 104A and the second inkjet chamber 104B are configured to deposit inkjet materials having physical and chemical properties that are not compatible within the same processing apparatus 304. Further, the first inkjet chamber 104A and the second inkjet chamber 104B are in communication via the transfer chamber 102. As such, the inkjet printing platform 100 is configured such that different inkjet materials may physically and/or chemically interact with each other on the substrate 320 to create optical films, optical device structures, and/or optical devices without leaving the environment of the inkjet printing platform. Therefore, the formation of optical films, optical device structures, and/or optical devices that otherwise are difficult to form with a homogeneous ink composition may be formed. The first inkjet chamber 104A includes one or more printheads 402A-402C configured to deposit an inkjet material with the first viscosity range and the second inkjet chamber 104B includes one or more printheads 402A-402C configured to deposit an inkjet material with the second viscosity range. The first viscosity range is different than the second viscosity range. For example, the first viscosity range is an aqueous inkjet material and the second viscosity range is an oil-based inkjet material.

Each of the plurality of printheads 402A-402C are coupled to one of the alignment mechanisms 408. The alignment mechanisms 408 align each of the plurality of printheads 402A-402C to each other. The plurality of printheads 402A-402C are aligned with a translational offset less than about 5 μm. The plurality of printheads 402A-402C are aligned with a rotational offset less than about 5 arcmin. Each of the plurality of printheads 402A-402C can be moved in at least the X direction, the Y direction, or the Z direction. In one embodiment, which can be combined with other embodiments described herein, the alignment mechanisms 408 are knobs coupled to the plurality of printheads 402A-402C. The knobs may be adjusted to align the plurality of printheads 402A-402C.

The plurality of ink recirculation modules 404A-404C are disposed in the case 314. The plurality of ink recirculation modules 404A-404C are disposed above the plurality of printheads 402A-402C. Each ink recirculation module 404A-404C is fluidly coupled to one of the plurality of printheads 402A-402C. For example, a first ink recirculation module 404A is coupled to the first printhead 402A, a second ink recirculation module 404B is coupled to the second printhead 402B, and a third ink recirculation module 404C is coupled to the third printhead 402C. The plurality of ink recirculation modules 404A-404C are operable to circulate the inkjet material such that the inkjet material continuously flows through the processing apparatus 304. The continuous flow of the inkjet material improves the deposition of the inkjet material during the inkjet printing process by reducing inkjet material settlement and clogging in the processing apparatus 304.

The processing apparatus 304 further includes at least one alignment camera 406. The alignment camera 406 is disposed in the case 314. The alignment camera 406 is operable to align the substrate within the inkjet printer 200 (shown in FIG. 2). A transfer robot 114 (shown in FIG. 1) provides the substrate into the inkjet chamber 104 and positions the substrate on a stage 306 (shown in FIG. 3). The at least one alignment camera 406 will derive the spatial coordinates of the substrate to ensure the substrate is aligned with respect to the processing apparatus 304 in the inkjet printer 200 (shown in FIG. 2). The alignment camera 406, in communication with a controller 310, adjusts the stage 306 to align the substrate. The alignment camera 406 is operable to move in the Z direction to focus on the substrate. The substrate may be aligned when the backside surface of the substrate is facing upward.

Figure 5:
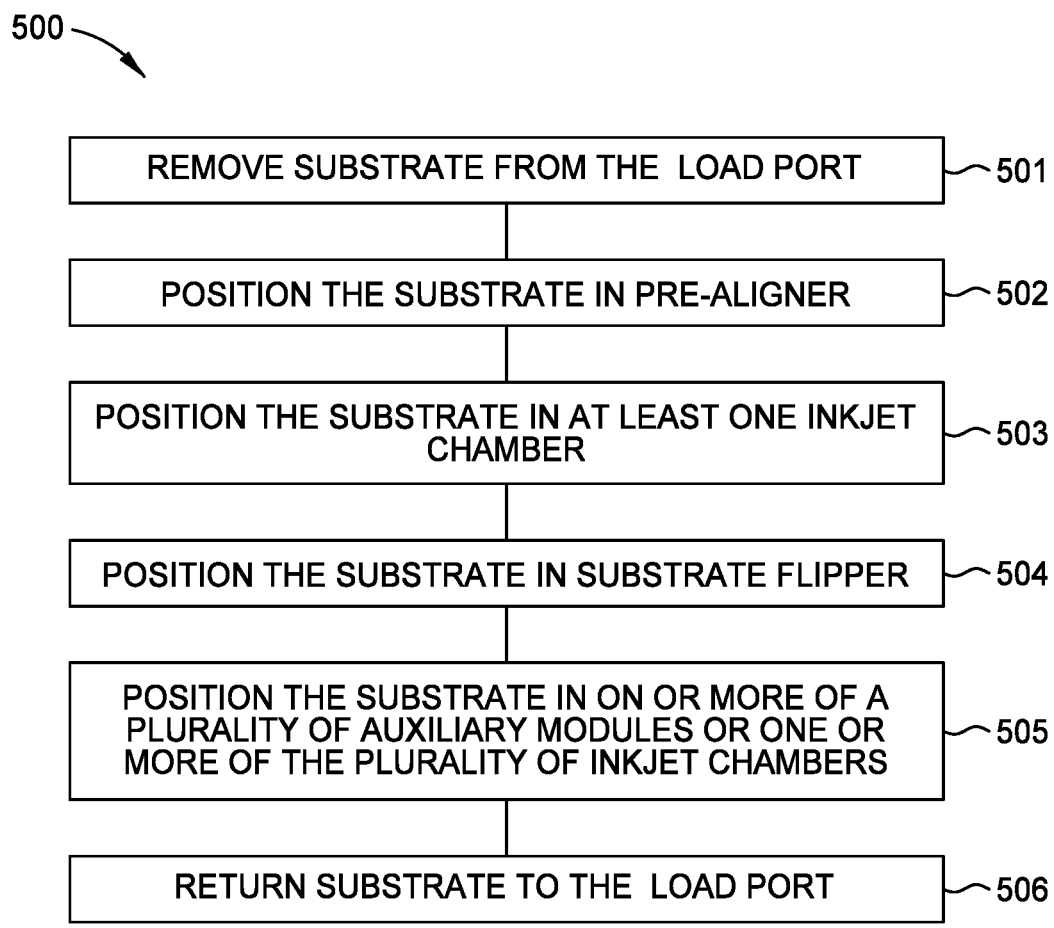
FIG. 5 is a flow diagram of a method of processing a substrate with the inkjet printing platform according to embodiments.

FIG. 5 is a flow diagram of a method 500 of processing a substrate with an inkjet printing platform 100. To facilitate explanation, the method 500 is described with reference to the inkjet printing platform 100 shown in FIG. 1. The method 500 is operable to form an optical film or at least one optical device on a substrate. The inkjet printing platform 100 allows integration with pre-process treatment and post-process treatment steps including (but not limited to) plasma cleaning, lithography, baking, cooling, curing, deposition, surface modification, and imprinting, which allows for completion of the entire method 500 within a controlled environment and a controlled duration, thus improving process quality and consistency of processing.

At operation 501, a substrate is removed from a load port 110. The substrate is removed from the load port 110 by a transfer robot 114 disposed in a transfer chamber 102 of the inkjet printing platform 100. At operation 502, the substrate is positioned in a pre-aligner 112. The transfer robot 114 places the substrate in the pre-aligner 112. The pre-aligner 112 reads an identification and the orientation of the substrate. The pre-aligner 112 aligns the substrate within the inkjet printing platform 100 based on the identification and the orientation of the substrate.

At operation 503, the substrate is positioned in at least one inkjet chamber 104. The transfer robot 114 places the substrate in at least one inkjet chamber 104. For example, the transfer robot 114 places the substrate in one of the first inkjet chamber 104A or the second inkjet chamber 104B coupled to the transfer chamber 102.

Upon entry into the inkjet chamber 104 through a slit valve 116, the transfer robot 114 positions the substrate on a stage 306 (shown in FIG. 3) of the inkjet printer 200. The substrate is chucked to the stage 306. The substrate includes at least two sets of fiducial marks. The substrate is placed in the field of view of an alignment camera 406 (shown in FIG. 4). The alignment camera 406 derives the spatial coordinates of the fiducial marks and calculates the rotational and translational offsets to be corrected via alignment. Based on the rotational and translational offsets, the stage 306 (shown in FIG. 3) is aligned with respect to the processing apparatus 304 in the inkjet printer 200 (shown in FIG. 2). When the substrate is aligned with respect to the processing apparatus 304, one or more inkjet materials may be deposited onto the substrate. The one or more inkjet materials physically and/or chemically interact with each other on the substrate to create the optical films, optical device structures, and/or optical devices. The inkjet materials deposited in the inkjet chambers 104 enable formation of complex optical films, optical device structures, and/or optical devices. During the deposition of the inkjet materials, a fan filter unit 206 and an exhaust port 208 continuously remove contaminants from the inkjet chamber 104.

The substrate, either before or after the operation 503, may be placed in one or more auxiliary modules 106. For example, the transfer robot 114 places the substrate in one or more of the auxiliary modules 106A-106C. The transfer robots 114 place the substrates into the auxiliary modules 106A-106C via a plurality of slit valves 116. The auxiliary modules 106A-106C are operable to perform a plurality of pre-processing treatments and/or a plurality of post-processing treatments. The pre-processing treatments and/or a plurality of post-processing treatments include but are not limited to plasma cleaning, lithography, baking, cooling, curing, deposition, surface modification, and imprinting. The auxiliary modules 106A-106C provide completion steps or preparation steps for the processing of the substrate within the inkjet printing platform 100. As the inkjet printing platform 100 is a controlled environment, process quality and consistency of the processing is improved. In one embodiment, which can be combined with other embodiments described herein, the substrate is positioned in more than one of the plurality of auxiliary modules 106.

At optional operation 504, the substrate is positioned in a substrate flipper 108. The substrate is removed from one of the auxiliary modules 106A-106C or one of the inkjet chambers 104 by the transfer robot 114. The transfer robot 114 positions the substrate in the substrate flipper 108. The substrate flipper 108 flips the substrate such that a backside surface of the substrate is facing upward. The substrate flipper 108 flips the substrate such that double-side processing may occur.

At optional operation 505, the substrate is positioned in one or more of the plurality of auxiliary modules 106 or one or more of the inkjet chambers 104. The substrate is removed from the substrate flipper 108 by the transfer robot 114. The substrate may be positioned such that double-side processing of the substrate may be performed. The capability of double-side processing of the substrate with backside surface alignment of the substrate provides for the formation of functional optical films on both sides of the substrate. The double-side processing expands the design space and functionality of the optical film or optical device to be formed.

At operation 506, the substrate is returned to the load port 110. The substrate is processed and returned to the load port 110 via one or more of the transfer robots 114.

In summation, an inkjet printing platform is described herein. The inkjet printing platform is utilized for fabrication of optical films and optical device structures. The inkjet printing platform includes a transfer chamber, one or more inkjet chambers, a plurality of auxiliary modules, a substrate flipper, and load ports. The inkjet printing platform is operable to perform an inkjet printing process on a substrate to form an optical film and/or an optical device. A processing apparatus of each inkjet chamber includes a plurality of printheads, a plurality of ink recirculation modules, at least one alignment camera, and a plurality of alignment mechanisms. An exhaust port and a fan filter unit are also included in each of the inkjet chambers. The inkjet printing platform described herein provides for substrate alignment with micron level precision, substrate edge handling capability without backside surface contamination, double-sided processing with pattern alignment, multi-material deposition capability with inter-material alignment, ink recirculation to optimize print consistency and to minimize ink settlement, seamless integration upstream and downstream with automated substrate handling, and the combination of the filter fan unit and the exhaust port provide pressure control in different sections of each of the inkjet chambers.

While the foregoing is directed to embodiments of the present disclosure, other and further embodiments of the disclosure may be devised without departing from the basic scope thereof, and the scope thereof is determined by the claims that follow.

What is claimed is:

1. An inkjet printing platform, comprising:
   a transfer chamber;
   at least one load port formed in the transfer chamber;
   a plurality of auxiliary modules coupled to the transfer chamber;
   a first inkjet chamber coupled to the transfer chamber, the first inkjet chamber including a first set of printheads configured to deposit inkjet materials with a first viscosity range;
   a second inkjet chamber coupled to the transfer chamber, the second inkjet chamber including a second set of printheads configured to deposit inkjet materials with a second viscosity range, wherein the first viscosity range is different from the second viscosity range;
   a substrate flipper coupled to the transfer chamber; and
   a pre-aligner disposed in the transfer chamber.

2. The inkjet printing platform of claim 1, wherein each of the auxiliary modules is one of a plasma module, lithography module, baking module, chilling module, ultraviolet (UV) curing module, or imprinting module.

3. The inkjet printing platform of claim 1, wherein the plurality of auxiliary modules are coupled to the transfer chamber via a plurality of slit valves.

4. The inkjet printing platform of claim 1, further comprising at least one transfer robot disposed in the transfer chamber, the at least one transfer robot operable to transfer a substrate throughout the inkjet printing platform.

5. An inkjet printing platform, comprising:
   a transfer chamber;
   a first inkjet chamber coupled to the transfer chamber, the first inkjet chamber including a first inkjet printer with a first set of printheads configured to deposit inkjet materials with a first viscosity range; and
   a second inkjet chamber coupled to the transfer chamber, the second inkjet chamber including a second inkjet printer with a second set of printheads configured to deposit inkjet materials with a second viscosity range, wherein the first viscosity range is different from the second viscosity range, the second inkjet printer comprising:
      a moveable stage configured to support a substrate and move along a pair of tracks; and
      a processing apparatus disposed above the moveable stage, the processing apparatus including:
         the second set of printheads;
         at least one alignment camera; and
         a plurality of ink recirculation modules coupled to each of the second set of printheads.

6. The inkjet printing platform of claim 5, the first viscosity range including oil-based inkjet materials and the second viscosity range including aqueous inkjet materials.

7. The inkjet printing platform of claim 5, wherein each printhead of the first set of printheads and the second set of printheads is operable to deposit different inkjet materials provided from a fluid supply manifold coupled to the first set of printheads and the second set of printheads.

8. The inkjet printing platform of claim 5, each printhead of the first set of printheads and the second set of printheads is operable to deposit the same inkjet materials from a fluid supply manifold coupled to the first set of printheads and the second set of printheads.

9. The inkjet printing platform of claim 5, further comprising:
   a plurality of auxiliary modules coupled to the transfer chamber wherein, each of the auxiliary modules is one of a plasma module, lithography module, baking module, chilling module, ultraviolet (UV) curing module, or imprinting module.

10. The inkjet printing platform of claim 9, wherein the first set of printheads includes a different number of printheads than the second set of printheads.

11. The inkjet printing platform of claim 5, further comprising a plurality of alignment mechanisms coupled to each of the first set of printheads and the second set of printheads, the plurality of alignment mechanisms operable to adjust a position of the first set of printheads and the second set of printheads.

12. The inkjet printing platform of claim 5, wherein the first inkjet chamber and the second inkjet chamber each include a fan filter unit and an exhaust port operable to continuously remove contaminants from a processing region therein.

13. The inkjet printing platform of claim 5, wherein the moveable stage includes vacuum slots elevated from a surface of the moveable stage, the vacuum slots operable to chuck the substrate to the moveable stage.

14. A method of processing a substrate, comprising:
removing a substrate from a load port of an inkjet printing platform;
positioning the substrate in a pre-aligner disposed in a transfer chamber of the inkjet printing platform, the substrate aligned by the pre-aligner;
positioning the substrate in at least one inkjet chamber coupled to the transfer chamber, the substrate positioned on a stage of an inkjet printer disposed in the inkjet chamber, the inkjet printer configured to deposit one or more inkjet materials on the substrate from a plurality of printheads;
positioning the substrate in at least one auxiliary module coupled to the transfer chamber, the auxiliary module configured to perform one or more of a plasma cleaning, lithography, baking, cooling, curing, deposition, surface modification, and imprinting process; and
returning the substrate to the load port of the inkjet printing platform.

15. The method of claim 14, wherein at least one transfer robot disposed in the transfer chamber is operable to move the substrate between the load port, the at least one inkjet chamber, and the at least one auxiliary module.

16. The method of claim 15, wherein the transfer robot is configured to handle edges of the substrate.

17. The method of claim 14, further comprising positioning the substrate in a substrate flipper coupled to the transfer chamber, the substrate flipper operable to flip the substrate such that a backside surface of the substrate is facing upwards.

18. The method of claim 17, further comprising positioning the substrate in at least one of the at least one inkjet chamber or the at least one auxiliary module such that the backside surface of the substrate is processed in the at least one inkjet chamber or the at least one auxiliary module.

19. The method of claim 14, wherein the one or more inkjet materials are circulated between the plurality of printheads and a plurality of ink recirculation modules coupled to each of the plurality of printheads.

20. The method of claim 14, further comprising aligning the stage and the substrate with respect to a processing apparatus of the inkjet printer, the aligning based on determining rotational and translational offsets of the substrate with an alignment camera disposed in the processing apparatus.

* * * * *